(12) United States Patent
Ibbetson et al.

(10) Patent No.: US 8,735,920 B2
(45) Date of Patent: May 27, 2014

(54) LIGHT EMITTING DIODE PACKAGE WITH OPTICAL ELEMENT

(75) Inventors: James Ibbetson, Santa Barbara, CA (US); Eric Tarsa, Goleta, CA (US); Michael Leung, Ventura, CA (US); Maryanne Becerra, Santa Barbara, CA (US); Bernd Keller, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 0 days.

(21) Appl. No.: 11/496,922

(22) Filed: Jul. 31, 2006

(65) Prior Publication Data

US 2008/0023711 A1    Jan. 31, 2008

(51) Int. Cl.
*H01L 33/00* (2010.01)

(52) U.S. Cl.
USPC  257/98; 257/100; 257/E33.068; 257/E33.07; 257/E33.073

(58) Field of Classification Search
USPC ......... 257/88, 89, 98, 100, E33.068, E33.07, 257/E33.073; 438/26, 27, 29
See application file for complete search history.

(56) References Cited

U.S. PATENT DOCUMENTS

| | | | | |
|---|---|---|---|---|
| 3,760,237 A | * | 9/1973 | Jaffe | ............................. 257/98 |
| 4,307,297 A | | 12/1981 | Groff | |
| 4,322,735 A | | 3/1982 | Sadamasa et al. | |
| 4,511,425 A | * | 4/1985 | Boyd et al. | ..................... 156/493 |
| 5,040,868 A | | 8/1991 | Waitl | |
| 5,042,048 A | | 8/1991 | Meyer | ............................ 372/108 |
| 5,122,943 A | | 6/1992 | Pugh | ............................. 362/256 |
| 5,130,761 A | | 7/1992 | Tanaka | ............................. 357/17 |
| 5,167,556 A | | 12/1992 | Stein | |
| 5,351,106 A | | 9/1994 | Lesko | ............................. 355/83 |
| 5,703,401 A | | 12/1997 | Van de Water et al. | |
| 5,706,177 A | | 1/1998 | Nather | |

(Continued)

FOREIGN PATENT DOCUMENTS

| CN | 1274906 A | 11/2000 |
|---|---|---|
| CN | 2498694 | 7/2002 |

(Continued)

OTHER PUBLICATIONS

Nichia Corp. White LED Part No. NSPW300BS, Specification for Nichia White LED, Model NSPW300BS, pp. Jan. 14, 2004.

(Continued)

*Primary Examiner* — Robert Huber

(74) *Attorney, Agent, or Firm* — Koppel, Patrick, Heybl & Philpott

(57) ABSTRACT

A light emitting diode (LED) package comprising a substrate with an LED chip mounted to the substrate and in electrical contact with it. An inner material covers the LED chip, and a lens covers the inner material with the lens material being harder than the inner material. An adhesive is arranged between the substrate and the lens to hold the lens to the substrate and to compensate for different coefficients of thermal expansion (CTE) between the lens and the remainder of the package. A method for forming an LED package comprises providing a substrate with a first meniscus ring on a surface of the substrate. An LED chip is mounted to the substrate, within the meniscus ring. An inner material is deposited over the LED chip, and a lens material in liquid form is deposited over the inner material. The lens material held in a hemispheric shape by the first meniscus feature and the lens material is cured making it harder than the inner material.

42 Claims, 4 Drawing Sheets

(56) References Cited

U.S. PATENT DOCUMENTS

| | | | |
|---|---|---|---|
| 5,731,547 A * | 3/1998 | Derwin et al. | 174/251 |
| 5,790,298 A | 8/1998 | Tonar | 359/267 |
| 5,813,753 A | 9/1998 | Vriens et al. | 362/293 |
| 5,907,151 A | 5/1999 | Gramann | |
| 5,942,770 A | 8/1999 | Ishinaga et al. | 257/89 |
| 5,959,316 A | 9/1999 | Lowery | 257/98 |
| 6,061,160 A | 5/2000 | Maruyama | 359/152 |
| 6,066,861 A | 5/2000 | Hohn et al. | |
| 6,183,100 B1 | 2/2001 | Suckow et al. | 362/35 |
| 6,224,216 B1 | 5/2001 | Parker et al. | 353/31 |
| 6,259,608 B1 | 7/2001 | Berardinelli et al. | |
| 6,274,924 B1 | 8/2001 | Carey et al. | 257/676 |
| 6,296,367 B1 | 10/2001 | Parsons et al. | 362/183 |
| 6,359,236 B1 | 3/2002 | DiStefano et al. | |
| 6,376,902 B1 | 4/2002 | Arndt | 257/678 |
| 6,447,124 B1 | 9/2002 | Fletcher et al. | 359/604 |
| 6,454,437 B1 | 9/2002 | Kelly | 362/246 |
| 6,469,321 B2 | 10/2002 | Arndt | |
| 6,480,389 B1 | 11/2002 | Shie et al. | 361/707 |
| 6,517,218 B2 | 2/2003 | Hochstein | 362/294 |
| 6,536,913 B1 | 3/2003 | Yajima et al. | 362/231 |
| 6,573,580 B2 | 6/2003 | Arndt | |
| 6,610,563 B1 | 8/2003 | Waitl | |
| 6,614,058 B2 | 9/2003 | Lin et al. | |
| 6,621,210 B2 | 9/2003 | Kato et al. | 313/496 |
| 6,624,491 B2 | 9/2003 | Waitl et al. | |
| 6,680,490 B2 | 1/2004 | Yasukawa et al. | |
| 6,686,609 B1 | 2/2004 | Sung | |
| 6,700,136 B2 | 3/2004 | Guida | 257/79 |
| 6,707,069 B2 | 3/2004 | Song et al. | 257/79 |
| 6,710,373 B2 | 3/2004 | Wang | |
| 6,717,353 B1 * | 4/2004 | Mueller et al. | 313/501 |
| 6,759,733 B2 | 7/2004 | Arndt | 257/672 |
| 6,765,235 B2 | 7/2004 | Taninaka et al. | 257/88 |
| 6,765,801 B1 * | 7/2004 | Glenn et al. | 361/764 |
| 6,770,498 B2 | 8/2004 | Hsu | 438/26 |
| 6,774,401 B2 | 8/2004 | Nakada et al. | |
| 6,791,259 B1 | 9/2004 | Stokes | |
| 6,858,879 B2 | 2/2005 | Waitl | |
| 6,872,585 B2 | 3/2005 | Matsumura et al. | |
| 6,876,149 B2 | 4/2005 | Miyashita | |
| 6,900,511 B2 | 5/2005 | Ruhnau et al. | |
| 6,911,678 B2 | 6/2005 | Fujisawa et al. | |
| 6,914,268 B2 | 7/2005 | Shei | |
| 6,919,586 B2 | 7/2005 | Fujii | |
| 6,940,704 B2 | 9/2005 | Stalions | |
| 6,946,714 B2 | 9/2005 | Waitl | |
| 6,964,877 B2 | 11/2005 | Chen et al. | 438/20 |
| 6,975,011 B2 | 12/2005 | Arndt | |
| 6,995,510 B2 | 2/2006 | Murakami et al. | |
| D517,025 S | 3/2006 | Asakawa | D13/180 |
| 7,009,627 B2 | 3/2006 | Abe et al. | 345/690 |
| 7,021,797 B2 | 4/2006 | Minano et al. | 362/355 |
| 7,064,907 B2 | 6/2006 | Kaneko | |
| 7,066,626 B2 | 6/2006 | Omata | 362/257 |
| 7,102,213 B2 | 9/2006 | Sorg | |
| 7,119,422 B2 | 10/2006 | Chin | 257/666 |
| 7,161,189 B2 | 1/2007 | Wu | 57/98 |
| 7,187,009 B2 | 3/2007 | Fukasawa et al. | 257/98 |
| 7,224,000 B2 | 5/2007 | Aanegola et al. | 257/98 |
| 7,244,965 B2 | 7/2007 | Andrews et al. | |
| 7,282,740 B2 | 10/2007 | Chikugawa et al. | 257/79 |
| 7,285,802 B2 | 10/2007 | Ouderkirk et al. | 257/98 |
| 7,303,315 B2 | 12/2007 | Ouderkirk et al. | 362/294 |
| D572,210 S | 7/2008 | Lee | D13/180 |
| D572,670 S | 7/2008 | Ono et al. | D13/180 |
| D576,574 S | 9/2008 | Kobayakawa | D13/180 |
| 7,429,757 B2 | 9/2008 | Oyama et al. | 257/675 |
| 7,579,628 B2 | 8/2009 | Inoguchi | 257/81 |
| 7,622,795 B2 | 11/2009 | Chiang | 257/675 |
| 7,635,915 B2 | 12/2009 | Xie et al. | 257/692 |
| 7,692,206 B2 | 4/2010 | Loh | 257/99 |
| 7,777,412 B2 | 8/2010 | Pang | 313/506 |
| 7,847,302 B2 * | 12/2010 | Basin et al. | 257/88 |
| 7,875,899 B2 | 1/2011 | Yasuda | 257/99 |
| 8,217,414 B2 | 7/2012 | Hayashi | 257/99 |
| 2002/0021085 A1 | 2/2002 | Ng | |
| 2002/0030194 A1 | 3/2002 | Camras et al. | |
| 2002/0061174 A1 | 5/2002 | Hurt et al. | |
| 2002/0066905 A1 | 6/2002 | Wang | |
| 2002/0123163 A1 | 9/2002 | Fujii | |
| 2002/0163001 A1 | 11/2002 | Shaddock | |
| 2002/0171911 A1 | 11/2002 | Maegawa | |
| 2002/0195935 A1 | 12/2002 | Jager | |
| 2003/0116769 A1 | 6/2003 | Song et al. | |
| 2003/0160256 A1 | 8/2003 | Durocher et al. | 257/88 |
| 2003/0183852 A1 | 10/2003 | Takenaka | |
| 2004/0016938 A1 | 1/2004 | Baretz et al. | 257/100 |
| 2004/0037076 A1 | 2/2004 | Katoh et al. | 362/235 |
| 2004/0041222 A1 | 3/2004 | Loh | |
| 2004/0047151 A1 | 3/2004 | Bogner et al. | |
| 2004/0079957 A1 | 4/2004 | Andrews et al. | |
| 2004/0080939 A1 | 4/2004 | Braddell et al. | |
| 2004/0126913 A1 | 7/2004 | Loh | |
| 2004/0217364 A1 | 11/2004 | Tarsa et al. | |
| 2004/0227149 A1 * | 11/2004 | Ibbetson et al. | 257/100 |
| 2004/0232435 A1 | 11/2004 | Hofer | |
| 2004/0238930 A1 | 12/2004 | Arndt | |
| 2004/0256706 A1 | 12/2004 | Nakashima | |
| 2005/0023548 A1 | 2/2005 | Bhat | |
| 2005/0072981 A1 * | 4/2005 | Suenaga | 257/88 |
| 2005/0077535 A1 | 4/2005 | Li | |
| 2005/0093005 A1 | 5/2005 | Ruhnau | |
| 2005/0093430 A1 * | 5/2005 | Ibbetson et al. | 313/501 |
| 2005/0110033 A1 | 5/2005 | Heremans et al. | 257/98 |
| 2005/0117320 A1 | 6/2005 | Leu et al. | |
| 2005/0127377 A1 | 6/2005 | Arndt | |
| 2005/0135105 A1 | 6/2005 | Teixeira et al. | |
| 2005/0152127 A1 | 7/2005 | Kamiya et al. | |
| 2005/0156187 A1 | 7/2005 | Isokawa | |
| 2005/0179041 A1 | 8/2005 | Harbers et al. | |
| 2005/0179376 A1 | 8/2005 | Fung et al. | |
| 2005/0199899 A1 | 9/2005 | Lin et al. | 257/99 |
| 2005/0231983 A1 | 10/2005 | Dahm | |
| 2005/0253130 A1 | 11/2005 | Tsutsumi et al. | 257/13 |
| 2006/0022212 A1 | 2/2006 | Waitl | |
| 2006/0049477 A1 | 3/2006 | Arndt | |
| 2006/0060867 A1 | 3/2006 | Suehirom | 257/81 |
| 2006/0091406 A1 | 5/2006 | Kaneko et al. | 257/81 |
| 2006/0102917 A1 | 5/2006 | Oyama et al. | |
| 2006/0108594 A1 * | 5/2006 | Iwasaki et al. | 257/98 |
| 2006/0131591 A1 | 6/2006 | Sumitani | |
| 2006/0133044 A1 | 6/2006 | Kim et al. | |
| 2006/0151809 A1 | 7/2006 | Isokawa | |
| 2006/0157828 A1 | 7/2006 | Sorg | |
| 2006/0220046 A1 | 10/2006 | Yu et al. | |
| 2006/0267042 A1 | 11/2006 | Izuno et al. | 257/100 |
| 2006/0278882 A1 | 12/2006 | Leung et al. | 257/98 |
| 2006/0291185 A1 | 12/2006 | Atsushi | 362/29 |
| 2007/0046176 A1 | 3/2007 | Bukesov et al. | |
| 2007/0096139 A1 | 5/2007 | Schultz | |
| 2007/0109779 A1 | 5/2007 | Sekiguchi et al. | |
| 2007/0145401 A1 | 6/2007 | Ikehara | |
| 2007/0170449 A1 | 7/2007 | Anandan | |
| 2007/0241357 A1 | 10/2007 | Yan | 257/98 |
| 2007/0262328 A1 | 11/2007 | Bando | |
| 2007/0269586 A1 | 11/2007 | Leatherdale | |
| 2007/0295975 A1 | 12/2007 | Omae | 257/89 |
| 2008/0013319 A1 | 1/2008 | Pei et al. | |
| 2008/0026498 A1 | 1/2008 | Tarsa et al. | 438/26 |
| 2008/0074032 A1 | 3/2008 | Yano et al. | 313/503 |
| 2008/0093606 A1 | 4/2008 | Pan et al. | |
| 2008/0121921 A1 | 5/2008 | Loh et al. | |
| 2008/0149960 A1 | 6/2008 | Amo et al. | 257/98 |
| 2008/0170391 A1 | 7/2008 | Norfidathul et al. | 362/227 |
| 2008/0186702 A1 | 8/2008 | Camras et al. | |
| 2008/0191232 A1 | 8/2008 | Lee et al. | |
| 2008/0198594 A1 | 8/2008 | Lee | |
| 2008/0230790 A1 | 9/2008 | Seko et al. | |
| 2008/0258156 A1 | 10/2008 | Hata | 257/88 |
| 2008/0296590 A1 | 12/2008 | Ng | 257/88 |
| 2008/0303052 A1 | 12/2008 | Lee et al. | |
| 2008/0308825 A1 | 12/2008 | Chakraborty | |
| 2009/0050908 A1 | 2/2009 | Yuan et al. | |

(56) References Cited

U.S. PATENT DOCUMENTS

| | | | |
|---|---|---|---|
| 2009/0050911 A1 | 2/2009 | Chakraborty | |
| 2009/0057699 A1 | 3/2009 | Basin | |
| 2009/0057708 A1 | 3/2009 | Abdul Karim et al. | 257/100 |
| 2009/0072251 A1 | 3/2009 | Chan et al. | 257/89 |
| 2009/0095966 A1 | 4/2009 | Keller et al. | 257/98 |
| 2009/0129085 A1 | 5/2009 | Aizar et al. | 362/247 |
| 2009/0189178 A1 | 7/2009 | Kim et al. | |
| 2009/0283781 A1 | 11/2009 | Chan et al. | |
| 2010/0044735 A1 | 2/2010 | Oyamada | |
| 2010/0103660 A1 | 4/2010 | Van de Ven et al. | 362/231 |
| 2010/0193822 A1 | 8/2010 | Inobe et al. | 257/98 |
| 2011/0049545 A1 | 3/2011 | Basin et al. | 257/98 |
| 2011/0108674 A1 | 5/2011 | Chu et al. | |
| 2011/0121345 A1 | 5/2011 | Andrews et al. | |
| 2011/0186880 A1 | 8/2011 | Kohler et al. | 257/91 |
| 2011/0193118 A1 | 8/2011 | Oshima et al. | |
| 2011/0278617 A1 | 11/2011 | Lee | |
| 2012/0235199 A1 | 9/2012 | Andrews et al. | |
| 2012/0257386 A1 | 10/2012 | Harbers et al. | 362/235 |

FOREIGN PATENT DOCUMENTS

| | | |
|---|---|---|
| CN | 2617039 Y | 5/2004 |
| CN | 2646873 | 10/2004 |
| CN | 1581527 A | 2/2005 |
| CN | 1591924 A | 3/2005 |
| CN | 1679168 A | 10/2005 |
| CN | 1720608 A | 1/2006 |
| CN | 1744335 A | 3/2006 |
| CN | 1801498 A | 7/2006 |
| CN | 1874011 A | 12/2006 |
| CN | 1913135 A | 2/2007 |
| CN | 1977399 A | 6/2007 |
| CN | 101005109 A | 7/2007 |
| CN | 101013689 | 8/2007 |
| CN | 10161590 A | 10/2007 |
| CN | 101360368 | 2/2009 |
| DE | 202007012162 | 4/2008 |
| EP | 1005085 A2 | 5/2000 |
| EP | 1187226 A1 | 3/2002 |
| EP | 1187227 | 3/2002 |
| EP | 1187228 | 3/2002 |
| EP | 1 418 630 A1 | 5/2004 |
| EP | 1521313 | 4/2005 |
| EP | 1 538 680 A2 | 6/2005 |
| EP | 1653254 A2 | 5/2006 |
| EP | 1864780 | 12/2007 |
| EP | 1 953 834 A1 | 8/2008 |
| GB | 2420221 A | 12/2004 |
| GB | 2420221 A | 5/2006 |
| GB | 2 458 972 A | 10/2009 |
| GB | 2466633 A | 7/2010 |
| JP | 53-118019 | 10/1978 |
| JP | S53118019 | 10/1978 |
| JP | S53126570 | 10/1978 |
| JP | 59-027559 | 2/1984 |
| JP | 59027559 | 2/1984 |
| JP | 61-048951 | 3/1986 |
| JP | 6148951 | 3/1986 |
| JP | 61048951 | 3/1986 |
| JP | S62160564 | 3/1986 |
| JP | 62047156 | 2/1987 |
| JP | 62140758 | 9/1987 |
| JP | 038459 | 1/1991 |
| JP | 03-171780 | 7/1991 |
| JP | 06-177424 | 6/1994 |
| JP | 7-202271 A | 8/1995 |
| JP | 07202271 | 8/1995 |
| JP | 08032120 | 2/1996 |
| JP | 61048951 | 3/1996 |
| JP | 8139257 | 5/1996 |
| JP | 10321909 | 12/1998 |
| JP | 11008405 | 1/1999 |
| JP | 11-054802 | 2/1999 |
| JP | 11-167805 A | 6/1999 |
| JP | 11150306 | 6/1999 |
| JP | 11261113 | 9/1999 |
| JP | 2000-188358 | 7/2000 |
| JP | 2000-223751 | 8/2000 |
| JP | 2000223752 | 8/2000 |
| JP | 2000261041 | 9/2000 |
| JP | 2001044506 | 2/2001 |
| JP | 2001-168400 | 6/2001 |
| JP | 2001237463 | 8/2001 |
| JP | 2001518692 | 10/2001 |
| JP | 2002009217 | 1/2002 |
| JP | 2002-223005 | 8/2002 |
| JP | 2002374005 | 12/2002 |
| JP | 2003-197974 | 7/2003 |
| JP | 2003-264267 | 9/2003 |
| JP | 2003318449 | 11/2003 |
| JP | 2003324214 | 11/2003 |
| JP | 2004022862 | 1/2004 |
| JP | 2004056075 | 2/2004 |
| JP | 2004507114 | 3/2004 |
| JP | 2004-111937 A | 4/2004 |
| JP | 2004103775 | 4/2004 |
| JP | 2004146815 | 5/2004 |
| JP | 2004-200236 | 7/2004 |
| JP | 2004228387 | 8/2004 |
| JP | 2004335740 | 11/2004 |
| JP | 2004335880 | 11/2004 |
| JP | 2005-019838 | 1/2005 |
| JP | 2005019838 | 1/2005 |
| JP | 2005-079167 | 3/2005 |
| JP | 2005150624 | 6/2005 |
| JP | 2005-310935 | 11/2005 |
| JP | 2005347401 | 12/2005 |
| JP | 2005539386 | 12/2005 |
| JP | 2006019557 | 1/2006 |
| JP | 2006508537 | 3/2006 |
| JP | 2006509372 A | 3/2006 |
| JP | 2006108517 | 4/2006 |
| JP | 2006-119357 | 5/2006 |
| JP | 2006-324331 | 11/2006 |
| JP | 2006344692 | 12/2006 |
| JP | 2007-094088 | 4/2007 |
| JP | 2007509505 | 4/2007 |
| JP | 2007-165029 | 6/2007 |
| JP | 2007165840 | 6/2007 |
| JP | 2007184542 | 7/2007 |
| JP | 2007243226 | 9/2007 |
| JP | 2007-273763 | 10/2007 |
| JP | 2007-287981 | 11/2007 |
| JP | 2007-299905 | 11/2007 |
| JP | 2007317896 | 12/2007 |
| JP | 2007329516 | 12/2007 |
| JP | 2008521236 | 6/2008 |
| WO | WO9931737 | 6/1999 |
| WO | WO0217405 | 2/2002 |
| WO | WO03049204 | 6/2003 |
| WO | 2004003660 | 4/2004 |
| WO | WO2004027882 | 4/2004 |
| WO | WO2004044877 | 5/2004 |
| WO | WO 2004/053933 A2 | 6/2004 |
| WO | WO2005104247 | 3/2005 |
| WO | WO2005043627 A1 | 5/2005 |
| WO | WO2006016398 | 2/2006 |
| WO | WO2006054228 | 5/2006 |
| WO | WO2006054228 A2 | 5/2006 |
| WO | WO2006054228 A3 | 5/2006 |
| WO | WO2006054228 | 6/2006 |
| WO | 2006135502 | 12/2006 |
| WO | WO 2007/083408 A1 | 7/2007 |
| WO | 2007121486 A2 | 10/2007 |
| WO | WO 2007/127029 A2 | 11/2007 |
| WO | WO2007122516 | 11/2007 |
| WO | WO2008081794 A1 | 7/2008 |
| WO | WO2008082098 | 7/2008 |
| WO | WO 2009/074919 A1 | 6/2009 |
| WO | WO2010005294 | 1/2010 |
| WO | 2012099145 A1 | 7/2012 |

(56) References Cited

OTHER PUBLICATIONS

Nichia Corp. White LED Part No. NSPW312BS , Specification for Nichia White LED , Model NSPW312BS, pp. Jan. 14, 2004.
Kim J.K et al. "Strongly Enhanced Phosphor Efficiency in GaInN White Light-Emitting Diodes Using Remote Phosphor Configuration and Diffuse Reflector Cup" Japanese Journal of Applied Physics, Japan Society of Applied Physics, Tokyo, JP, vol. 44, No. 20-23, Jan. 1, 2005 Xp-001236966, pp. 649-651.
JP 2001 060072A , Abstract, Matsushita Electric Ind. Co. Ltd., Mar. 6, 22201.
Preliminary Notice of Reasons for Refusal re related Japanese Application No. 2009-002857, dated: Apr. 24, 2009, pp. 1-2.
Preliminary Notice of Reasons for Refusal re related Japanese Application No. 2009-002857, dated: Jul. 24, 2009.
Official Notice of Decision for Refusal regarding related Japanese Design Application No. 2009-002857, dated Nov. 17, 2009.
Declaration of Gerald Negley under 37 C.F.R.§ 1.132, dated: Aug. 20, 2009.
Declaration of Charles Swoboda under 37 C.F.R.§ 1.132, dated: Aug. 19, 2009.
From related Chinese application: Chinese Application No. 200710142310.7 Notice on Office Action dated Dec. 11, 2009.
(From related application: International Search Report for PCT/CN2009/074800 mailed Feb. 25, 2010.
Office Action from China Application No. 200710142310.7. dated: Dec. 11, 2009.
First Office Action for Chinese Patent Application No. 200780019643.9 dated Mar. 29, 2010, only considered English parts of supplied document.
Office Action from U.S. Appl. No. 11/149,998, dated: Nov. 20, 2009.
Response to Office Action from U.S. Appl. No. 11/149,998, dated: Feb. 22, 2010.
Office Action from U.S. Appl. No. 12/154,691, dated: Dec. 17, 2009.
Response to Office Action from U.S. Appl. No. 12/154,691, dated: May 17, 2010.
Office Action from U.S. Appl. No. 11/465,120, dated: Mar. 9, 2010.
Office Action from U.S. Appl. No. 12/152,766, dated: Mar. 12, 2010.
Office Action from U.S. Appl. No. 12/069,827, dated: Apr. 20, 2010.
Office Action from U.S. Appl. No. 12/321,059, dated: May 17, 2010.
Office Action from U.S. Appl. No. 11/149,998, dated: May 18, 2010.
Appeal Decision in Japanese Design Patent Application No. 2009-002857 (Appeal No. 2010-002154) mailed Aug. 20, 2010.
International Search Report and Written Opinion from PCT/CN2010/001009 mailed Oct. 21, 2010.
International Search Report and Written Opinion from PCT/US2010/001852 mailed Nov. 11, 2010.
Notification of First Office Action in Chinese Application No. 200880009255.7 mailed Sep. 26, 2010.
Office Action from U.S. Appl. No. 12/291,293, dated: Jul. 19, 2011.
Response to Office Action from U.S. Appl. No. 12/291,293, OA dated: Jul. 19, 2011, Resp. dated: Oct. 19, 2011.
Office Action from U.S. Appl. No. 11/465,120, dated: Jun. 14, 2011.
Office Action from U.S. Appl. No. 12/069,827, dated: Jun. 16, 2011.
Response to Office Action from U.S. Appl. No. 12/069,827, OA dated: Jul. 16, 2011, Resp. dated: Aug. 3, 2011.
Office Action from U.S. Appl. No. 12/321,059, dated: Jun. 22, 2011.
Response to Office Action from U.S. Appl. No. 12/321,059, OA dated: Jun. 22, 2011, Resp. dated: Aug. 22, 2011.
Office Action from U.S. Appl. No. 12/321,059, dated: Aug. 26, 2011.
Response to Office Action from U.S. Appl. No. 12/321,059, OA dated: Jun. 22, 2011, Resp. dated: Sep. 20, 2011.
Office Action from U.S. Appl. No. 12/695,978, dated: Sep. 14, 2011.
Office Action from U.S. Appl. No. 11/149,998, dated: Sep. 21, 2011.
Office Action from U.S. Appl. No. 12/321,059, dated: Oct. 4, 2011.
Office Action from U.S. Appl. No. 12/069,827, dated: Oct. 26, 2011.
CREE® XLAMP® MC-E LEDs Product Info Sheets, p. 1-3.
Nichia Corporation LEDs, Models NSSM016G, NSSM227, NESM026X, NSSM026BB, NESM005A, 9 Pages.
Notice of Reasons for Rejection for Japanese Patent Application No. 2007-211901 dated Apr. 14, 2011.
International Preliminary Report on Patentability for PCT/CN2010/070073 mailed Apr. 28, 2011.
International Search Report and Written Opinion for PCT/CN2010/001865 mailed Jun. 9, 2011.
Office Action in related U.S. Appl. No. 12/002,410, dated: Apr. 26, 2011.
Office Action in related U.S. Appl. No. 12/002,410, dated: May 25, 2010.
Office Action in related U.S. Appl. No. 12/002,410, dated: Dec. 13, 2010.
Office Action in related U.S. Appl. No. 11/149,998, dated: May 11, 2011.
Office Action in related U.S. Appl. No. 11/149,998, dated: Aug. 27, 2010.
Office Action in related U.S. Appl. No. 11/149,998, dated: Jan. 24, 2011.
Office Action in related U.S. Appl. No. 11/149,998, dated: Nov. 20, 2009.
Response to OA in related U.S. Appl. No. 11/149,998, dated: Nov. 20, 2009, Response filed: Feb. 22, 2010.
Office Action in related U.S. Appl. No. 11/149,998, dated: May 18, 2010.
Office Action in related U.S. Appl. No. 12/291,293, dated: May 27, 2010.
Office Action in related U.S. Appl. No. 12/291,293, dated: Sep. 3, 2010.
Office Action in related U.S. Appl. No. 12/291,293, dated: Mar. 1, 2011.
Office Action in related U.S. Appl. No. 12/152,766, dated: Oct. 7, 2010.
Office Action in related U.S. Appl. No. 12/152,766, dated: Apr. 1, 2011.
Office Action in related U.S. Appl. No. 12/152,766, dated: Mar. 12, 2010.
Office Action in related U.S. Appl. No. 11/465,120, dated: Sep. 8, 2010.
Office Action in related U.S. Appl. No. 11/465,120, dated: Dec. 13, 2010.
Office Action in related U.S. Appl. No. 11/465,120, dated: Mar. 9, 2010.
Office Action in related U.S. Appl. No. 12/635,818, dated: Oct. 14, 2010.
Office Action in related U.S. Appl. No. 12/695,978, dated: Dec. 20, 2010.
Office Action in related U.S. Appl. No. 12/695,978, dated: May 10, 2011.
Office Action in related U.S. Appl. No. 12/069,827, dated: Oct. 29, 2010.
Office Action in related U.S. Appl. No. 12/069,827, dated: Apr. 20, 2010.
Office Action in related U.S. Appl. No. 12/069,827, dated: Jan. 27, 2011.
Office Action in related U.S. Appl. No. 12/154,691, dated: Dec. 17, 2009.
Response to OA in related U.S. Appl. No. 12/154,691, dated: Dec. 17, 2009, Response filed: May 17, 2010.
Office Action in related U.S Appl. No. 12/321,059, dated: May 17, 2010.
Notice of Reasons for Rejection for Japanese Patent Application No. JP 2008-515699 dated May 19, 2011.
Notice of Reasons for Rejection for Japanese Patent Application No. JP 2009-507195 dated Jun. 10, 2011.
Notice of Reasons for Rejection for Japanese Patent Application No. JP 2008-281533 dated Jun. 24, 2011.
First Office Action for Chinese Patent Application No. 200710152109.7 issued Jul. 29, 2011.
Extended Supplementary European Search Report for Application No. EP 07789665.2 dated Nov. 7, 2011.
Second Office Action for Chinese Patent Application No. CN200880009255.7 mailed Oct. 13, 2011.

(56) References Cited

OTHER PUBLICATIONS

International Search Report and Written Opinion for PCT Application No. PCT/US2011/001457 mailed Dec. 13, 2011.
Interrogation from Japanese Patent Application No. 2007-211901, dated Aug. 21, 2012.
Examination Report from European Patent Application No. 07789665.2, dated Aug. 20, 2012.
Decision of Rejection from Chinese Patent Application No. 200880009255.7, dated Sep. 5. 2012.
Notification of the First Office Action from Chinese Patent Application No. 201010167346.2, dated Feb. 29, 2012.
Office Action from U.S. Appl. No. 11/465,120, mailed Dec. 9, 2011.
Office Action from U.S. Appl. No. 12/002,410, mailed Mar. 28, 2012.
Office Action from U.S. Appl. No. 12/002,410, mailed Dec. 21, 2011.
Response to Office Action for U.S. Appl. No. 12/002,410, filed Mar. 8, 2012.
Office Action from U.S. Appl. No. 12/757,179, mailed Jan. 19, 2012.
Office Action from U.S. Appl. No. 12/321,059, mailed Feb. 10, 2012.
Response to Office Action for U.S. Appl. No. 12/321,059, filed Apr. 9, 2012.
Advisory Action from U.S. Appl. No. 12/321,059, mailed Apr. 20, 2012.
Office Action from U.S. Appl. No. 12/695,978, mailed Mar. 14, 2012.
Office Action from U.S. Appl. No. 11/982,275, mailed Mar. 23, 2012.
Office Action from U.S. Appl. No. 12/614,989, mailed Mar. 12, 2012.
Office Action from U.S. Appl. No. 12/069,827, mailed Apr. 3, 2012.
Notice of Reasons for Rejection from Japanese Patent Application No. 2009-507195, dated May 8, 2012.
First Office Action for Chinese Patent Application No. 200980153995.2, dated May 4. 2012.
First Office Action for Chinese Patent Application No. 200910145412.3, dated Apr. 28, 2012.
First Office Action for Chinese Patent Application No. 201110039138.9, dated Jun. 4, 2012.
Decision of Rejection from Japanese Patent Application No. 2008-515699, dated Jul. 17, 2012.
Decision of Rejection for Japanese Patent Application No. 2007-211901. dated: Jan. 30. 2012.
First Office Action from Chinese Patent Application No. 201080001658.4, dated Sep. 24, 2012.
Extended Search Report for European Patent Application No. 09824413 0-1551, dated Feb. 11, 2013.
Second Office Action from Chinese Patent Appl. No. 201110039138.9, dated Jan. 31. 2013.
International Search Report and Written Opinion from PCT application No. PCT/US2012/065060, dated Feb. 20, 2013.
Communication from European Patent Appl. No. 09824413.0-1551, dated Feb. 28. 2013.
European Search Report from European Patent Appl. No. 09824413.0-1551, dated Feb. 11. 2013.
Notice of Reasons for Rejection from Japanese Patent Appl No. 2011-534993. dated Mar. 12, 2013.
Notification of the Second Office Action from Chinese Patent Application No 201010167346.2, dated Feb. 17, 2013.
Third Office Action from Chinese Patent Application No. 200710152109.7, dated: Mar. 5. 2013.
Interrogation from Japanese Patent Application No. 2008-515699, dated Feb. 19, 2013.
Decision of Rejection from Japanese Patent Application No. 2009-507195, dated May 21, 2013.
Notice of Reasons for Rejection from Japanese Patent Appl. No. 2011-259253, dated May 28, 2013.
Decision of Rejection from Japanese Patent Appl. No. 2008-281533, dated May 28, 2013.
Decision of Rejection from Chinese Patent Appl. No. 201080001658.4, dated Jun. 20, 2013.
Office Action from U.S. Appl. No. 12/868,567, dated Jul. 5, 2013.
Office Action from U.S. Appl. No. 12/875,873, dated Jul. 3, 2013.
Office Action from U.S. Appl. No. 12/757,891, dated Jun. 18, 2013.
Office Action from U.S. Appl. No. 11/982,275, dated May 9, 2013.
Office Action from U.S. Appl. No. 12/069,827, dated Mar. 5, 2013.
Response to OA from U.S. Appl. No. 12/069,827, filed Jun. 5, 2013.
Office Action from U.S. Appl. No, 11/149,998, filed Apr. 3, 2013.
Response to OA from U.S. Appl. No. 11/149,998, filed Jun. 25, 2013.
Office Action from U.S. Appl. No. 12/868,567, dated Sep. 12, 2012.
Response to OA from U.S. Appl. No. 12/868,567, filed Jan. 14, 2013.
Office Action from U.S. Appl. No. 11/982,275, dated Sep. 18, 2012.
Response to OA from U.S. Appl. No. 11/982,275, filed Sep. 27, 2012.
Office Action from U.S. Appl. No. 12/002,410, dated Sep. 25, 2012.
Response to OA from U.S. Appl. No. 12/002,410, filed Dec. 18, 2012.
Office Action from U.S. Appl. No. 12/069,827, dated Aug. 9, 2012.
Response to OA from U.S. Appl. No. 12/069,827, filed Nov. 9, 2012.
Office Action from U.S. Appl. No. 11/465,120, dated Aug. 21, 2012.
Response to OA from U.S. Appl. No. 11/465,120, filed Aug. 24, 2012.
Office Action from U.S. Appl. No. 12/875,873, dated Aug. 22, 2012.
Response to OA from U.S. Appl. No. 12/875,873, filed Nov. 19, 2012.
Office Action from U.S. Appl. No. 11/465,120, dated Jun. 19, 2012.
Response to OA from U.S. Appl. No. 11/465,120, filed Aug. 15, 2012.
Office Action from U.S. Appl. No. 11/982,275, dated Jul. 9, 2012.
Response to OA from U.S. Appl. No. 11/982,275, filed Sep. 18, 2012.
Office Action from U.S. Appl. No. 12/757,179, dated Jul. 16, 2012.
Response to OA from U.S. Appl. No. 12/757,179, filed Sep. 25, 2012.
Office Action from U.S. Appl. No. 12/069.827, dated Dec. 6, 2012.
Response to OA from U.S. Appl. No. 12/069,827, filed Jan. 29, 2013.
Office Action from U.S. Appl. No. 11/982,275, dated Nov. 28, 2012.
Response to OA from U.S. Appl. No. 11/982,275, filed Mar. 21, 2013.
Office Action from U.S. Appl. No. 12/757,891, dated Nov. 28, 2012.
Response to OA from U.S. Appl. No. 12/757,891, filed Jan. 28, 2013.
Office Action from U.S. Appl. No. 13/306,589, dated Feb. 20, 2013.
Response to OA from U.S. Appl. No. 13/306,589, filed May 16, 2013.
Office Action from U.S. Appl. No. 12/002,410, dated Jan. 29, 2013.
Response to OA from U.S. Appl. No. 12/002,410, filed Apr. 18, 2013.
Office Action from U.S. Appl. No. 12/868.567, dated Feb. 22, 2013.
Response to OA from U.S. Appl. No. 12/868,567, filed May 21, 2013.
Office Action from U.S. Appl. No. 12/875,873, dated Feb. 21, 2013.
Response to OA from U.S. Appl. No. 12/875,873, filed Apr. 19, 2013.
Office Action from U.S. Appl. No. 12/291,293, dated Feb. 28, 2013.
Response to OA from U.S. Appl. No. 12/291,293, filed Jun. 5, 2013.
Office Action from U.S. Appl. No. 12/695,978, dated Apr. 18, 2013.
Response to OA from U.S. Appl. No. 12/695,978, filed Jul. 10, 2013.
Fourth Office Action from Chinese Patent Appl. No. 200710152109.7, dated Jun. 28, 2013.
Office Action from U.S. Appl. No. 11/149,998, dated Jul. 26, 2013.
Office Action from U.S. Appl. No. 11/982,275, dated Aug. 8, 2013.
Office Action from U.S. Appl. No. 12/069,827, dated Jul. 3, 2013.
Office Action from U.S. Appl. No. 12/291,293, dated Aug. 20, 2013.
Notice of Reasons for Rejection from Japanese Patent Application No. 2007-211901, dated Apr. 9, 2013.
Decision of Rejection from Japanese Patent Application No. 2011-545616, dated Apr. 26, 2013.
Appeal Decision from Japanese Patent Appl. No. 2008-515699, dated Sep. 20, 2013.
Decision of Rejection from Chinese Patent Appl. No. 201001067346.2, dated Aug. 30. 2013.
Notice of Reasons for Rejection from Japanese Patent Appl. No. 2007-211901, dated Oct. 8, 2013.
Notification of Loss of Rights from European Patent Appl. No. 09824413.0, dated Oct. 17, 2013.
Appeal board's Questioning from Japanese Patent Appl. No. 2011-545616, dated Nov. 12, 2013.
Office Action from U.S. Appl. No. 12/069,827, dated Oct. 25, 2013.
Office Action from U.S. Appl. No. 12/875,873, dated Oct. 18, 2013.
Office Action from Japanese Patent Appl. No. 2012-288000, dated Oct. 8, 2013.
Decision of Rejection from Chinese Patent Appl. No. 201110039138.9 dated Sep. 25, 2013.
Office Action from U.S. Appl. No. 12/695,978, dated Sep. 17, 2013.
Office Action from U.S. Appl. No. 13/652,241, dated Sep. 11, 2013.
Office Action from U.S. Appl. No. 12/002,410, dated Sep. 10, 2013.

(56) References Cited

OTHER PUBLICATIONS

Interrogation from Japanese Patent Appl. No. 2009-507195, dated Jan. 28, 2014.
Notification of Designation of the Appeal Examiner from Japanese Patent Appl. No. 2009-507195, dated Jan. 22, 2014.
Interrogation from Japanese Patent Appl. No. 2008-281533, dated Jan. 21, 2014.
International search Report and Written Opinion from PCT/US2013/073921. dated Feb. 18, 2014.
Decision of Registration from Japanese Design Appl. No. 2012-030304. dated Jan. 21, 2014.
Office Action from U.S. Appl. No. 11/982,275, dated Jan. 7, 2014.
Office Action from U.S. Appl. No. 12/291.293, dated Dec. 31, 2013.
Fifth Office Action from Chinese Patent Appl. No. 2007/10152109.7. dated Jan. 6, 2014.
Supplemental European Search Report from European Patent Appl. No. 10731037.7. dated Jan. 9. 2014.
Search Report for European Patent Appl. No. 10731037.7, dated Dec. 11, 2013.
Notice of Reasons for Rejection from Japanese Patent Appl. No. 2011-534993, dated Nov. 12, 2013.

\* cited by examiner

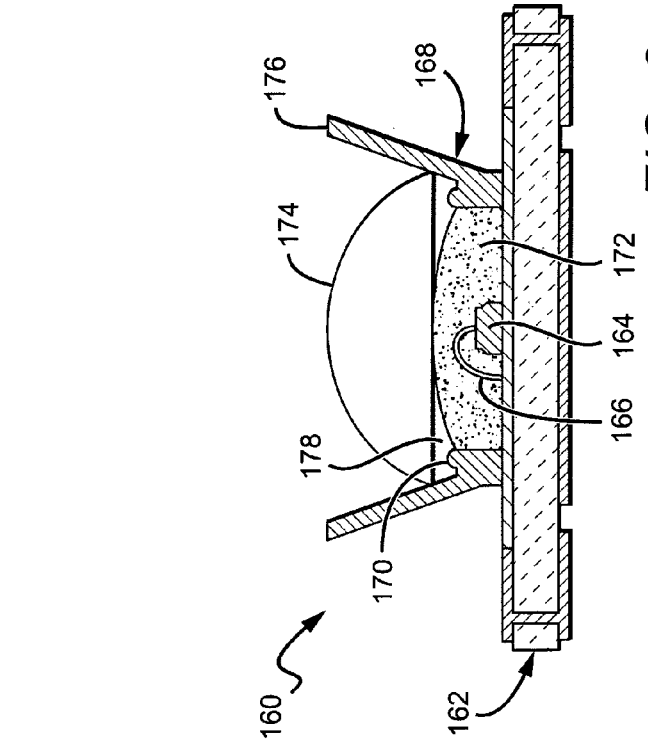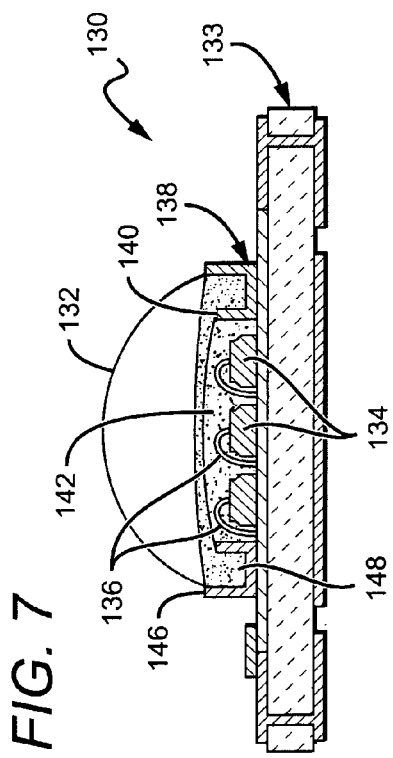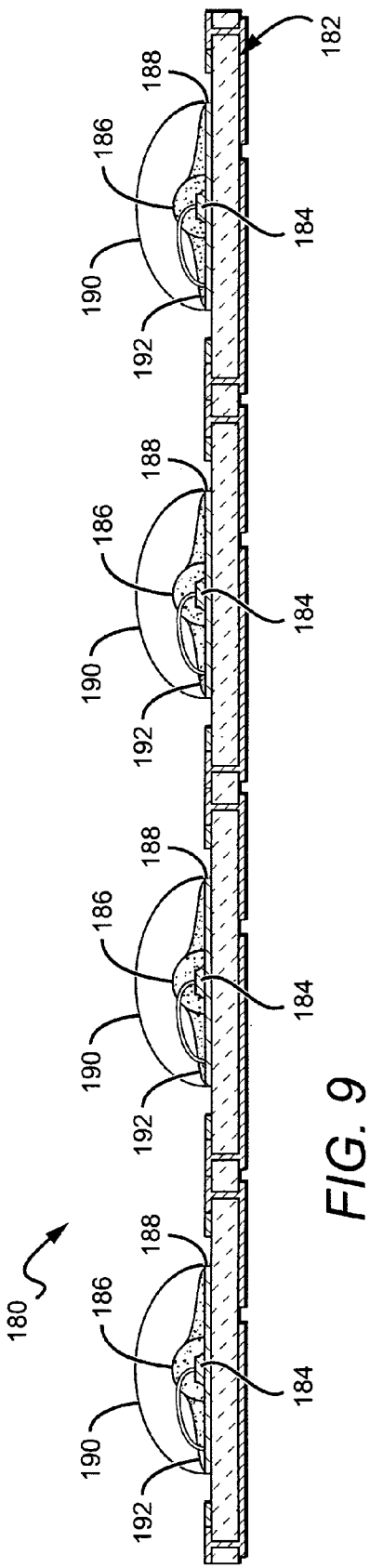

LIGHT EMITTING DIODE PACKAGE WITH OPTICAL ELEMENT

BACKGROUND OF THE INVENTION

1. Field of the Invention

This invention relates to semiconductor light emitting diodes (LEDs) and more particularly to LED packages with optical elements.

2. Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED. The useful light is generally emitted in the direction of the LED's top surface.

Conventional LEDs cannot generate white light from their active layers. One way to produce white light from conventional LEDs is to combine different colors from different LEDs. For example, the light from red, green and blue LEDs, or blue and yellow LEDs can be combined to produce white light. In addition, different colors of light are often generated from different types of LEDs which can require complex fabrication to combine in one device. The resulting devices can also require complicated control electronics since the different diode types can require different control voltages. Long term wavelength and stability of these devices is also degraded by the different aging behavior of the different LEDs.

Light from a single blue emitting LED has been converted to white light by surrounding the LED with a yellow phosphor, polymer or dye. [See Nichia Corp. white LED, Part No. NSPW300BS, NSPW312BS, etc., which comprise blue LEDs surrounded by a yellow phosphor powder; see also U.S. Pat. No. 5,959,316 to Lowery, entitled Multiple Encapsulation of Phosphor-LED Devices.] The surrounding material downconverts the wavelength of some of the LED light, changing its color. For example, a nitride based blue emitting LED chip can be surrounded by a yellow phosphor. Some of the blue light will pass through the phosphor without being changed while the remaining light will be downconverted to yellow. The LED will emit both blue and yellow light, which combine to produce white light. Another example of LEDs using this approach includes U.S. Pat. No. 5,813,753 to Vriens et al.

LED packages typically have some type of encapsulant surrounding the LED chip to enhance light extraction from the chip and protect the chip and related contacts structure (e.g. wire bonds) from exposure to physical damage or environmental conditions which could lead to corrosion or degradation. Along with this encapsulant, an optical element such as a simple hemispherical lens is also desired to enhance light extraction from the package and possibly to provide some form of output light beam shaping (control over the angle-dependent emission properties of the lamp). For surface mount packages, which typically require high temperature (200-300° C.) solder reflow processing to attach the LED package to its final fixture, the possible materials typically include silicones and glasses. Silicone lenses are typically molded using injection molding processes, which can place limitations on the properties of the silicone that may be used. Glass lenses are typically formed using a melting process that can limit the possible geometries and add substantial piece part cost to the final lamp. Typical wire bonded LEDs cannot be encapsulated in molten glass because of the high melting temperature of glass.

Present surface-mount LED package technology typically utilizes either a separate glass lens or a molded silicone lens. These lenses represent separate piece parts that must be affixed to the part during package assembly. The parts also represent additional cost due to the required lens fabrication, and may be difficult to attach. The lenses can also be made of materials (e.g. silicone) with a different coefficient of thermal expansion (CTE) compared to the surrounding package components. This can result in the cracking or delaminating of the LED chip or package elements, both of which can reduce light extraction from the LED package. This difference in CTE can also result in damage to the LED chip, and in particular the wire bond can be broken or pulled from the LED resulting in failure of the LED package.

SUMMARY OF THE INVENTION

One embodiment of a light emitting diode (LED) package according to the present invention comprises a substrate with an LED chip mounted to the substrate and in electrical contact with said substrate. An inner material covering the LED chip and a lens covering the inner material and being harder than the inner material. An adhesive is arranged between the substrate and the lens, the adhesive holding the lens to the substrate and compensating for different coefficients of thermal expansion (CTE) between the lens the remainder of the package.

Another embodiment of an LED package according to the present invention comprises a substrate and an LED chip mounted to the substrate and in electrical contact with the substrate. A first meniscus holding feature on the substrate around the LED chip and an inner material covering the LED chip. A lens is included having a substrate contacting surface. The lens is made of a material harder than said inner material and is mounted on the substrate, over said inner material at its mounting surface. The meniscus holding feature defines the edge of the lens mounting surface.

One embodiment of an LED array according to the present invention comprises a plurality of LED chips mounted on a substrate, with the substrate arranged to apply an electrical signal to each of the LED chips. An inner material covers at least one of the LED chips, and a lens comprising a material harder than the inner material and covering each of the inner material. An adhesive is arranged between the substrate and each of the lenses, with the adhesive holding the lens to the substrate and compensating for different coefficients of thermal expansion between the lens the remainder of the package.

One embodiment of a method for forming an LED package according to the present invention comprises providing a substrate with a first meniscus ring on a surface of the substrate. An LED chip is mounted to the substrate, within the meniscus ring. An inner material is deposited over the LED chip, and a lens material in liquid form is deposited over the inner material, with the lens material held in a hemispheric shape by the first meniscus feature. The lens material is then cured making it harder than the inner material.

These and other aspects and advantages of the invention will become apparent from the following detailed description and the accompanying drawings which illustrate by way of example the features of the invention.

BRIEF DESCRIPTION OF THE DRAWINGS

FIG. 7 is a sectional view of another embodiment of an LED package according to the present invention having a separately formed piece part lens and multiple LED chips;

FIG. 8 is a sectional view of another embodiment of an LED package according to the present invention having a separately formed piece part lens;

FIG. 9 is a sectional view of one embodiment of an LED array according to the present invention.

DETAILED DESCRIPTION OF THE INVENTION

Figure 1:
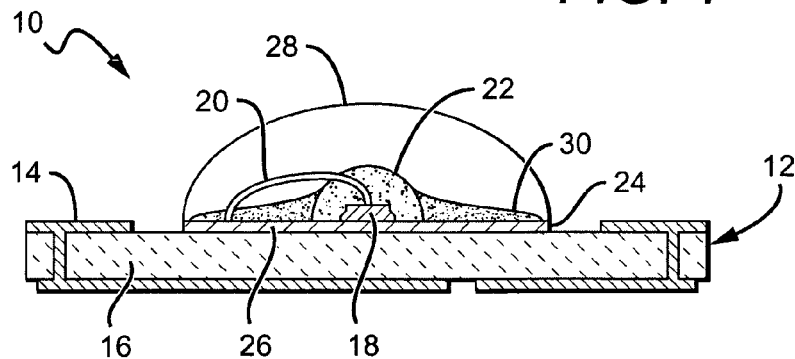
FIG. 1 is a sectional view of one embodiment of an LED package according to the present invention having a meniscus holding feature, inner material and outer lens.

The present invention comprises a dispensed optical element or lens that may be fabricated directly on the LED lamp using common processing (e.g. dispensing) processes and equipment. The invention is particularly applicable to fabricating LED packages without the need for additional piece part (i.e. separately formed) lenses, although aspects of this invention can also be used with packages utilizing piece part fabricated lenses. The dispensed lens embodiments according to the present invention may be fabricated using a variety of available silicone or epoxy materials, allowing application to surface mount LED packages or arrays. Surface features, herein referred to as meniscus forming features or meniscus rings, may be included on the LED package to allow a substantially hemispherical lens to be formed from a liquid lens material by allowing formation of a meniscus. The term "substantially hemispherical" and related terms are meant to convey a variety of curved surfaces, including but not limited to ones having essentially elliptical cross-section.

After dispensing, the lens can be cured or processed to provide a stable surface. The geometry of the resulting lens may be controlled using the geometry of the meniscus forming features, the rheology of the dispensed material or materials, the processing steps (e.g. sequential dispense steps of different materials or followed by specific process steps such as curing, etc.), the curing or processing orientation (e.g. parts may be cured or processing in an inverted position in order to utilize gravitational effects). The geometry can also be controlled by the application of surface energy modifying compounds to various surfaces either inside or outside the meniscus forming features (e.g., the use of a anti-wetting coating such as a fluorocarbon polymer having a surface energy well below the surface tension of the lens material) to reduce the chance of the lens material "breaking out" of the meniscus thereby allowing the build-up of higher lens features, and other factors which may effect the surface energy of the dispensed liquid prior to processing or curing. If necessary, the adhesive material such as an adhesive silicone may be used in conjunction with the lens to improve attachment strength of the lens and to compensate for CTE mismatches between the cured lens and other LED package materials.

The dispensed lens can provide a reproducible lens with a smooth finish without the need for procuring and handling additional lens piece parts. Further, since the encapsulants used for surface mount LED packages are typically comprised of silicones, the dispensed lens may be fabricated from a similar silicone material which is compatible in terms of chemical nature, thermal expansion properties, adhesion, etc. A variety of hard silicone materials have been developed that are well suited for a dispensing and curing to form a protective surface. In many cases these same materials are not well suited to forming piece part lenses by injection molding. For LED arrays, which may contain a large number of LED chips, the dispensed lens process provides a convenient method for forming a large number of reproducible optical elements in an efficient and inexpensive manner.

The present invention utilizes materials of different polymetric hardness in different locations to form a reliable LED package with a hard encapsulant or lens protecting the LED chip and its electrical connections. One method for measuring hardness of polymetric materials is by Shore durometers, with rigid materials registering a high durometer reading and soft gel-like materials registering a low durometer reading. Packages according to the present invention have one or more LEDs mounted to a package or substrate, with one package being a surface mount package having a ceramic substrate. Soft stable inner materials having low durometer readings (e.g. less than 50 on Shore durometer 00 scale) are provided on the substrate surrounding the LED and most or all of the LED's wire bonds. The soft material is preferably in a substantially hemispheric shape over the LED. The soft material can enhance light extraction from the LED chip and protect the chip and wire bonds from exposure to physical damage or environmental conditions. During thermal cycles, the soft material also reduces failure by allowing the LED wire bonds to "flex" or even "cut" through the soft material during expansion or contraction, instead of being pulled from the LED or package bonding surfaces, or broken.

To further protect the LED chip and its wire bonds, a harder outer material with a higher durometer reading (greater than 30 on Shore durometer A Scale) are provided over the soft material also in a substantially hemispheric shaped encapsulant or lens ("lens"). As mentioned above, for larger devices (i.e 4 mm and above) a silicone adhesive can be provided between the harder hemispheric lens and the package substrate (and lens) with the adhesive also having a lower durometer reading than the lens, preferable with rubbery and/or elastic characteristics. The silicone adhesive holds the lens to the package while at the same time compensating for CTE mismatches between the LED package and lens. As the lens expands during thermal cycles at a different rate than the substrate or other package components, the low durometer characteristics of the silicone adhesive allow it to stretch or deform. This allows the lens to be held to the package without delaminating or cracking.

LED packages according to the present invention can have one or more meniscus holding features that allow the different materials to be dispensed in liquid form on the package and held in the desired substantially hemispheric shape until cured. Meniscus forming features generally comprise a physical transition that is arranged so that a meniscus forms by surface tension between a liquid and the physical transition. The term "meniscus" refers to the convex surface of liquid which is formed by surface tension. The physical transitions can be features such as edges, corners, ledges, trenches, rings, and any other physical transition that creates a meniscus when a liquid surface comes in contact with it. The meniscus holding features are primarily described below as rings, but it is understood that the meniscus holding features can have many different shapes such as square or oval with these influencing the overall shape of the liquid held by the feature.

In one embodiment, an inner meniscus ring can be provided on the package substrate, around the LED chip, and the soft low durometer reading material can be dispensed in a liquid on the package substrate, over the LED chip. The meniscus formed between the inner ring and the dispensed material forms the material in a substantially hemispheric shape over the LED. The material can then be cured to its soft, low durometer state. An outer meniscus holding ring can be included on the package substrate, around the soft inner material. The material for the lens (encapsulant) can be dispensed in liquid form over the soft material. The outer meniscus holding feature holds the lens material in a substantially hemispheric shape over the softer material and is cured to its hardened state. For larger devices, an adhesive silicone can be included to adhere the lens to the package and to compensate for mismatches in CTE. The inner soft material and lens can also include light conversion materials such as phosphors, and also light scattering particles.

The present invention is described herein with reference to certain embodiments but it is understood that the invention can be embodied in many different forms and should not be construed as limited to the embodiments set forth herein. It is also understood that when an element such as a layer, region or substrate is referred to as being "on" another element, it can be directly on the other element or intervening elements may also be present. Furthermore, relative terms such as "inner", "outer", "upper", "above", "lower", "beneath", "below" and "overlies", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIG. 1 shows one embodiment of LED package 10 according to the present invention that comprises a surface mount substrate 12. It is understood that many different substrates (submounts) can be used other than surface mount substrates, and the substrates can be made of many different materials. Surface mount substrates are known in the art and only briefly discussed herein. In one embodiment, the surface mount substrate 12 can comprise a ceramic core 16 with conductive features 14 deposited on surfaces of the core 16. The conductive features can comprise conductive traces made of a conductive material such as plated copper. The surface mount substrate 12 is arranged to be mounted to a final fixture using solder reflow processes known in the art.

The package 10 also comprises an LED chip 18 mounted to the substrate 12 using known mounting methods. In other embodiments more than one LED chip can be included. The details of operation and fabrication of conventional LED chips are also generally known in the art and are only briefly discussed. Conventional LEDs can be fabricated by known methods, with a suitable method being fabrication by Metal Organic Chemical Vapor Deposition (MOCVD). In operation, an electrical signal can be applied across the LED's oppositely doped layer causing the LED's active region to emit light.

In the LED package 10, the LED chip 18 is in electrical contact with the conductive features 14 such that a bias applied to the conductive features 14 is conducted to the LED chip 18, causing it to emit light. It is understood that the LED chip 18 can be in electrical contact with the substrate using different arrangements depending on factors such as the LED chip geometry and layout of the conductive features 14. In the embodiment shown, the LED chip is contacted by a wirebond 20 and through its contacting surface with the substrate. In other embodiments, more than one wire bond can be used or the LED chip can be contacted in different ways. It is further understood that in some embodiments, the LED chip is not in electrical contact with the substrate.

An inner material 22 is provided over the LED chip 18 and at least part of the wire bond 20 that is preferably soft (low durometer reading) and preferably formed in a substantially hemispheric shape over the LED chip 18. The inner material 22 can be dispensed in liquid form over the LED chip and then cured to its low durometer state. In one embodiment, an inner meniscus ring can be included around the LED chip 18 to hold the inner material 22 in its hemispheric shape. In other embodiments, the inner material can be held in its hemispheric shape by surface tension between the top of the substrate 12 and the dispensed material. The inner material can comprise many different materials alone or in combination, with a suitable material being a soft silicone having a low durometer reading, commercially available from Nye Lubricants, Inc.

The inner material can also comprise light conversion materials, such as phosphors. In one embodiment according to the present invention the LED chip 18 emits light in the blue wavelength spectrum and the phosphor absorbs some of the blue light and re-emits yellow. The led package 10 emits a white light combination of blue and yellow light. A full range of broad yellow spectral emission is possible using conversion particles made of phosphors based on the $(Gd,Y)_3(Al,Ga)_5O_{12}$:Ce system. The following lists other suitable phosphors used as conversion particles in an LED package 10, although others can be used. Each exhibits excitation in the blue and/or UV emission spectrum, provides a desirable peak emission, has efficient light conversion, and has acceptable Stokes shift:

Yellow/Green $(Sr,Ca,Ba) (Al,Ga)_2S_4:Eu^{2+}$ $Ba_2 (Mg, Zn) Si_2O_7:Eu^{2+}$ $Gd_{0.46}Sr_{0.31}Al_{1.23}O_xF_{1.38}Eu^{2+}_{0.06}$
$(Ba_{1-x-y}Sr_xCa_y)SiO_4:Eu$
$Ba_2SiO_4:Eu^{2+}$
Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
$CaAlSiN_3:Eu^{2+}$
$Sr_2Si_5N_8:Eu^{2+}$ The conversion materials can have different concentrations in the inner material 22 depending on the conversion efficiency of the material. The conversion particles can be uniformly dispersed in the inner material, or the particles can settle around the LED so that the particles are closer to the LED. The inner material 22 can also contain materials to help scatter the light, such as scattering particles. Once the inner material 22 is dispensed in, it can be cured using known methods, such as heat or UV curing, to harden.

The LED package 10 further comprises an outer meniscus holding ring 24 that can be included on the substrate 12, around the soft inner material 22. As shown, the meniscus holding ring 24 comprises the edge of disc 26 on the substrate surface. The disc can be made of many different materials, with a suitable material being etched plated copper. The material for the lens (encapsulant) 28 is dispensed in liquid form over the inner material 22. The outer meniscus holding feature holds the material for the lens 28 in a substantially hemispheric shape over the inner material 22, and is cured to its hardened state having a high durometer reading. The lens can be cured to a rigid material or can be cured to a rubbery/elastic material. Many different materials can be used for the lens, with a suitable material being Sylgard® 184 commercially available from Dow Corning. In other embodiments a commercially available epoxy may be used.

For smaller devices (i.e. 1-2 mm) the CTE mismatch between the lens 28 and the substrate 12 may not cause delamination or cracking. For larger devices (i.e. greater than 4 mm) delamination or cracking may be a greater concern. For all sized devices it may be desirable to include an adhesive to hold the lens 28 to the substrate. For these devices a layer of adhesive 30 can be included to adhere the lens 28 to the substrate 12 and to compensate for CTE mismatches. The adhesive 30 can cover all of the surface of the substrate 12 between the lens 28 and substrate 12, or a portion of the surface. The adhesive 30 can also be in other are areas, such as between the inner material 22 and the lens 28.

The adhesive 30 can be applied using many different methods, such as known dispensing methods. Many different materials can be used for the adhesive, with a suitable material being an adhesive silicone such as GE 3221S commercially available from General Electric. The silicone adhesive preferably has a durometer reading higher than the inner material 22 such that it has flexible properties but is rigid enough to firmly adhere the lens 28 to the substrate. During temperature cycles, the substrate 12 and lens 28 can expand and contract at different rates depending on the CTE of the materials. The silicone adhesive is arranged to compensate for the CTE mismatches to prevent delamination and cracking.

In the embodiment shown, most of the wire bond 20 is in the soft inner material, with a portion of it in the lens 28. The more of the wirebond 20 that is in the inner material the more reliable the LED package 10 can be through thermal cycles. In a preferred embodiment, all of the wire bond 20 is in the inner material.

Figure 2:
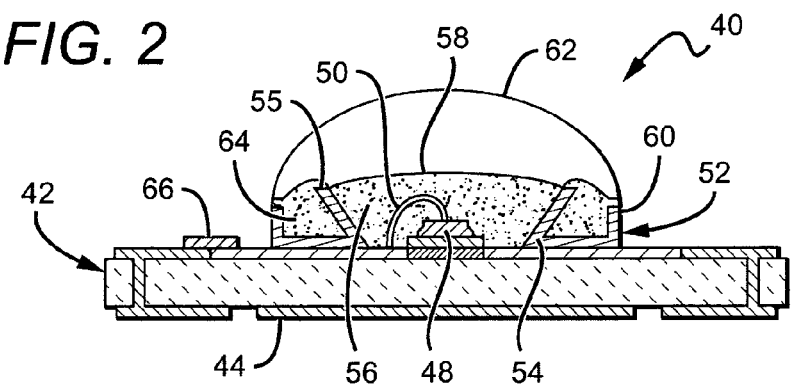
FIG. 2 is a sectional view of another embodiment of an LED package according to the present invention comprising a different meniscus holding feature.

FIG. 2 shows another embodiment of an LED package 40 according to the present invention comprising a substrate 42 with conductive elements 44, LED chip 48 and wire bond 50 similar to those in the LED package 10 in FIG. 1 and described above. The package 10 further comprises a meniscus ring 52 around the LED chip 48, with the ring 52 having a generally U-shaped cross-section. The ring 52 can be a lead frame or stamped part mounted to the substrate 42 using known mounting methods. The ring's inner portion being angled to form a cup 54. The surface of the cup can be reflective to reflect out sideways emitted light from the LED chip 48. The cup is also arranged to hold inner material 56 that is similar to the inner material 22 in FIG. 1. The material is preferably a soft silicone that can have phosphor materials and scattering particles. In LED package 40, the wire bond 50 can be completely in the soft inner material as shown, and in other embodiments can be in other locations.

The upper edge 55 of the cup 54 can serve as a physical transition and meniscus holding feature. When the inner material 56 is dispensed into the cup 54 in liquid form, the meniscus formed at the upper edge 55 can hold the inner material with a curved upper surface 58. The liquid can be held this way until cured to its soft state. As with the LED package 10 in FIG. 1, the soft material allows for expansion and contraction of the inner material during thermal cycles with the wire bond 50 cutting through the material instead of the material breaking or pulling from its contact point.

The meniscus ring also comprises an outer portion 60 that serves as the physical transition and meniscus holding feature for the material that forms the lens 62. When the lens material is dispensed over the inner material 56, the meniscus formed at the outer portion 60 holds the lens material in a substantially hemispheric shape over the inner material 56. The lens material can then be cured to form the lens 62. The lens 62 can be made of many different materials, with a suitable material being the material used for lens 28 in FIG. 1.

As described above, for all devices, and in particular large devices, the CTE mismatch between the ens 62 and the substrate 42 can cause lens delamination and cracking. To minimize this danger and to provide a reliable adhesion between the lens 62 and the remainder of the package 40, an adhesive 64 can be included primarily between the meniscus ring 52 and the lens 62. In other embodiments, although, it can also be included between the inner material 56 and the lens 62. The adhesive 64 can be made of many different materials, but is preferably made of the same material used for adhesive 30 in FIG. 1. The package 40 can also comprise a known electrostatic discharge (ESD) chip 66 to protect the LED chip 48 and the remainder of the package 40 from damage caused by electrostatic discharge.

Figure 3:
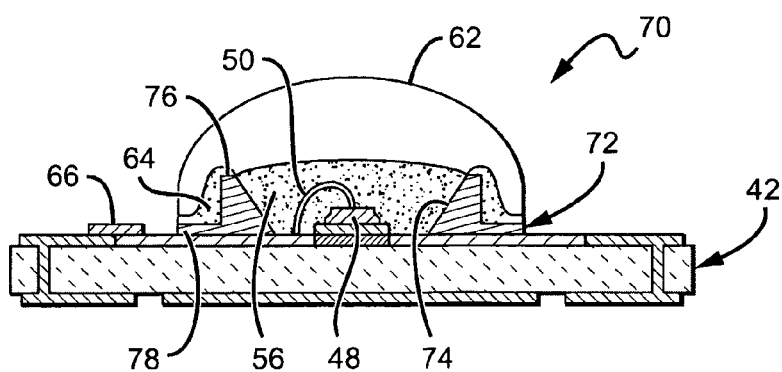
FIG. 3 is a sectional view of another embodiment of an LED package according to the present invention comprising a transparent meniscus holding feature.

FIG. 3 shows another embodiment of an LED package 70 according to the present invention having many elements similar to those in the LED package 40 in FIG. 2. For those elements and/or features in this figure (and the figures described below) that are similar to those in FIG. 2, the same reference numbers are used with the understanding that the description of those referenced from FIG. 2 applies to the reference number herein.

The LED package 70, comprises a substrate 42, LED chip 48, wire bond 50, inner material 56, lens 62, adhesive layer 64 and ESD chip 66. The package 70 also comprises a meniscus ring 72 around the LED chip 48 that can also be a lead frame or stamped part. The meniscus ring 72, however, has a cross section different from the meniscus ring 52 in FIG. 2. The inner surface of the meniscus ring is angled to form a cup 74 with a reflective surface and an upper edge 76 that serves as the meniscus holding feature for the inner material 56. The outer edge 78 of the meniscus ring 72 serves as the meniscus holding feature of the material that forms the lens 62. This outer edge 78 forms a meniscus with the lens material and holds the material in substantially hemispheric shape until cured.

Figure 4:
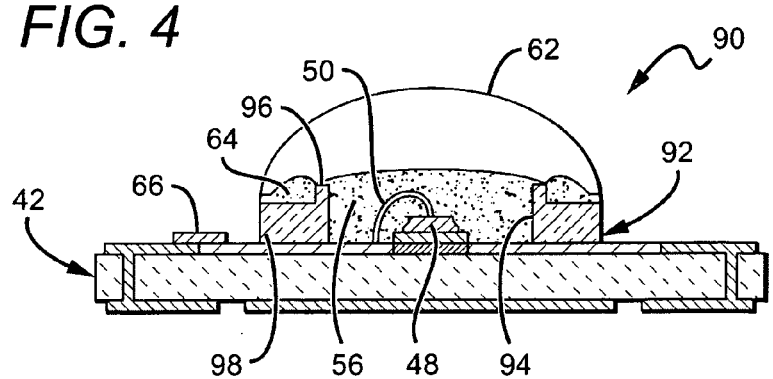
FIG. 4 is a sectional view of another embodiment of an LED package according to the present invention with a different transparent meniscus holding feature.

FIG. 4 shows another embodiment of an LED package 90 according to the present invention comprising a substrate 42, LED chip 48, wire bond 50, inner material 56, lens 62, adhesive layer 64 and ESD chip 66. The package 90 also comprises a meniscus ring 92 that is not a lead frame or stamped part, but is instead made of a transparent material such as a molded hard silicone or glass. By being transparent, the meniscus ring 92 allows for more of the sideways emitted light from the LED chip 48 to pass through the meniscus ring 92 and emit light from the sides of the LED package 90, instead of being reflected. This allows for improved sideways emission for the LED package 90. Because no reflective surface is provided, the inner surface 94 of the meniscus ring 92 can be vertical. The upper edge 96 serves as the meniscus holding feature for the inner material 56. The meniscus holding feature of the material that forms the lens 62 is the outer edge 98 of the meniscus ring 92. The outer edge 98 forms the meniscus to hold the lens material in a substantially hemispheric shape until cured.

Figure 5:
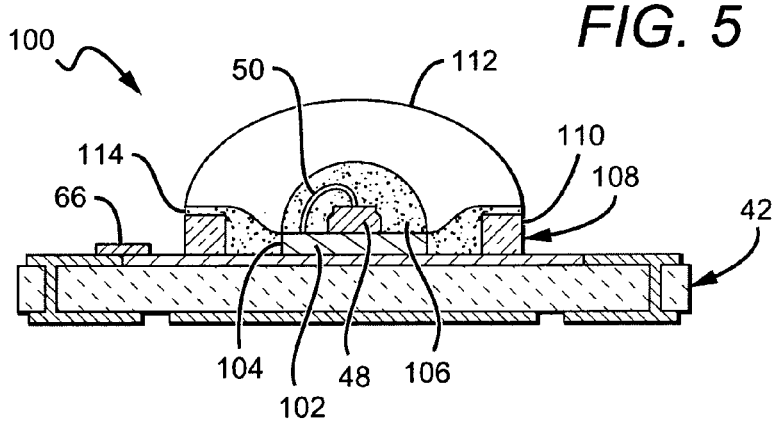
FIG. 5 is a sectional view of still another embodiment of an LED package according to the present invention with a transparent meniscus holding feature.

FIG. 5 shows another embodiment of a LED package 100 according to the present invention comprising a substrate 42, LED chip 48, wire bond 50, and ESD chip 66 similar to those in FIGS. 2-4. A submount 102 included between the LED chip 48 and the substrate 42, with the submount 102 preferably made of a conductive material so that an electrical signal from the substrate 42 can be conducted to the LED chip 48 through the submount 102. The submount edge 104 preferably forms a ring around the LED chip 48 and serves as a meniscus holding feature for the inner material 106. The inner material 106 is preferably soft and formed of the same material as the inner materials described above. It can be dispensed over the LED chip 48 in liquid form, with the meniscus at the edge 104 holding the liquid in a substantially hemispheric shape over the LED chip 48 until cured.

A meniscus ring 108 is included on the substrate 42 around the inner material 106 that is also made of transparent hard silicone or glass, although lead frame or stamped meniscus rings can also be used. The meniscus ring 108 does not provide a meniscus holding feature for the inner material, and provides outer meniscus ring edge 110 as the meniscus holding feature for the lens 112. A space can be provided between the inner material 106 and the meniscus ring 108 that can be at least partially filled with the lens material during formation of the lens 112. The cured lens 112 is preferably made of a hard material similar to the lens materials described above. An adhesive 114 can be provided to hold the lens 112 in place and/or compensate for CTE mismatches. The adhesive 114 can comprise an adhesive silicone as described above, and can cover all or a portion of the meniscus ring 108 and surface of the substrate 42 between the meniscus ring 108 and inner material 106.

Figure 6:
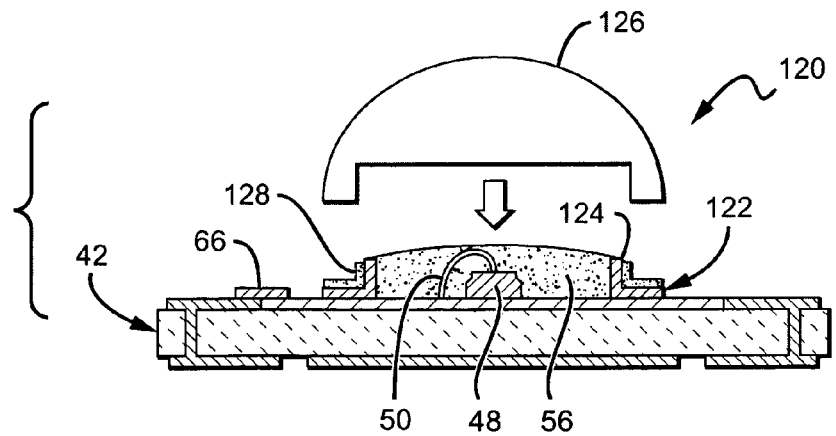
FIG. 6 is a sectional view of another embodiment of an LED package according to the present invention having a separately formed piece part lens.

As mentioned above, LED packages according to the present invention can also use preformed piece part lenses. FIG. 6 shows another embodiment of an LED package 120 comprising a substrate 42, LED chip 48, wire bond 50, inner material 56, and ESD chip 66 similar to those in FIGS. 2-4. The LED package 120 also comprises a meniscus ring 122 having an L-shaped cross-section with its upper edge 124 being the meniscus holding feature for the inner material 56. The meniscus ring can be made of a hard transparent material or a lead frame or stamped material. A preformed (piece part) lens 126 is included that is sized and shaped to fit over the meniscus ring 122 and inner material 56. The lens 126 can be glass, hard epoxy or hard silicone and can be hollow to provide a space for the inner material and vertical portion of the meniscus ring 122. An adhesive 128 can be provided, preferably between the meniscus ring 122 and lens 126, to hold the lens and to compensate for CTE mismatches and can be a silicon adhesive as described above.

FIG. 7 shows another embodiment of an LED package 130 according to the present invention utilizing a piece part lens 132 made of glass, hard epoxy or hard silicone. The package 130 comprises a substrate 132 with three LED chips mounted to it in electrical contact with the substrate 132 through their contacting surfaces and wire bonds 136. Each of the LED chips 134 can have a bias applied to it causing it to emit light alone or in combination with the other LED chips 134. A meniscus ring 138 is mounted to the substrate 132, around the LED chips 134, and can be made many of different materials such as a transparent silicone or glass. The meniscus ring 138 having a meniscus holding feature 140 for the inner material 142. As described above, the inner material can be dispensed in liquid form over the LED chips 134 with the meniscus at the feature 140 forming the liquid in hemispheric shape over the LED chips until cured in its hemispheric shape.

The meniscus ring 138 has a U-shaped cross-section with an outer portion 146 projecting up higher than the feature 140. The lens 132 as shown has a flat bottom surface and is mounted over the inner material 142 with a adhesive 148, such as an adhesive silicone described above, used to adhere the lens 132 to the package 130. The adhesive can be in different locations in the package 130, and as shown fills the space between the lens 132, inner material 142 and the meniscus ring 138. The outer leg 146 holds the adhesive 148, and in some embodiments is sized to prevent lateral movement of the lens 132. As also described above, the adhesive 148 can compensate for CTE mismatches between the lens 132 and remainder of the LED package 130.

FIG. 8 shows still another embodiment of an LED package 160 according to the present invention comprising a substrate 162 with an LED chip 164 mounted to it, although it is understood that more than one LED chip 164 can be utilized. A wire bond 166 is used to apply a bias to the LED chip 164 and a meniscus ring 168 is mounted to the substrate 162 around the LED chip 164. The package further comprises a meniscus holding feature 170 that holds the inner material in a hemispheric shape over the LED chip 164 until curing.

A piece part lens 174 having hemispherical or other geometry and made of glass, hard epoxy or hard silicone is mounted over the inner material 172. The meniscus ring 168 has an extended outer portion 176 that is sized so that the lens 174 can be arranged within the outer portion 176 over the inner material 172. In one embodiment, the lens 174 can snap in place in the outer portion 176. The space 178 between the bottom of the lens 174 and the meniscus ring 168 and inner material 172 can be filled with air, an optical coupling material, adhesive, or a combination thereof.

The present invention is particularly applicable to providing simple and inexpensive LED arrays. FIG. 9 shows one embodiment of an LED array 180 according to the present invention having substrate 182 with a plurality of LED chips 184 each of which is mounted in electrical contact with the substrate 182. Each also has a soft inner material 186, meniscus holding ring 188, a lens 190, and adhesive silicon 192 all arranged similar to these same features in the LED package 10 of FIG. 1.

The inner material, adhesive silicon, and lens can all be dispensed and cured using known methods. The meniscus holding arrangement allows for repeatable encapsulating of the LED chips, with the array 180 having a plurality of substantially uniform emitters. The LED 180 is shown with one row of four LED chips 184, but it is understood that the LED array 180 can have many rows of LED chips, and each of the rows can have fewer or more LED chips 184.

Figure 10:
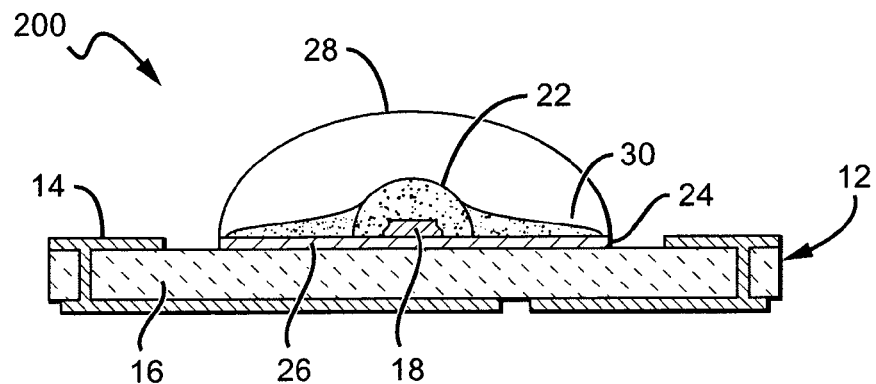
FIG. 10 is a sectional view of another embodiment of an LED package according to the present invention having an LED chip without wire bonds.

The embodiments above describe and show the LED chip being contacted by a wire bond and through its contacting surface with the substrate. As described above, however, more than one wire bond can be used or the LED chip can be contacted in different ways. FIG. 10 shows an LED package 200 that is similar to the LED package 10 in FIG. 1 and has a substrate 12, conductive features 14, substrate core 16, LED chip 18, inner material 22, meniscus holding ring 24, disk 26, lens 28, and adhesive 30. The LED package 200, however, does not have a wire bond. The LED chip 18 comprises two bottom contacts that are electrically coupled to the conductive features 14. This arrangement is particularly applicable to lateral geometry LED chips that in some embodiments can be flip chip mounted to the substrate. Each of the embodiments above can comprise an LED chip contacted to the substrate and its conductive features without wire bonds.

Figure 11:
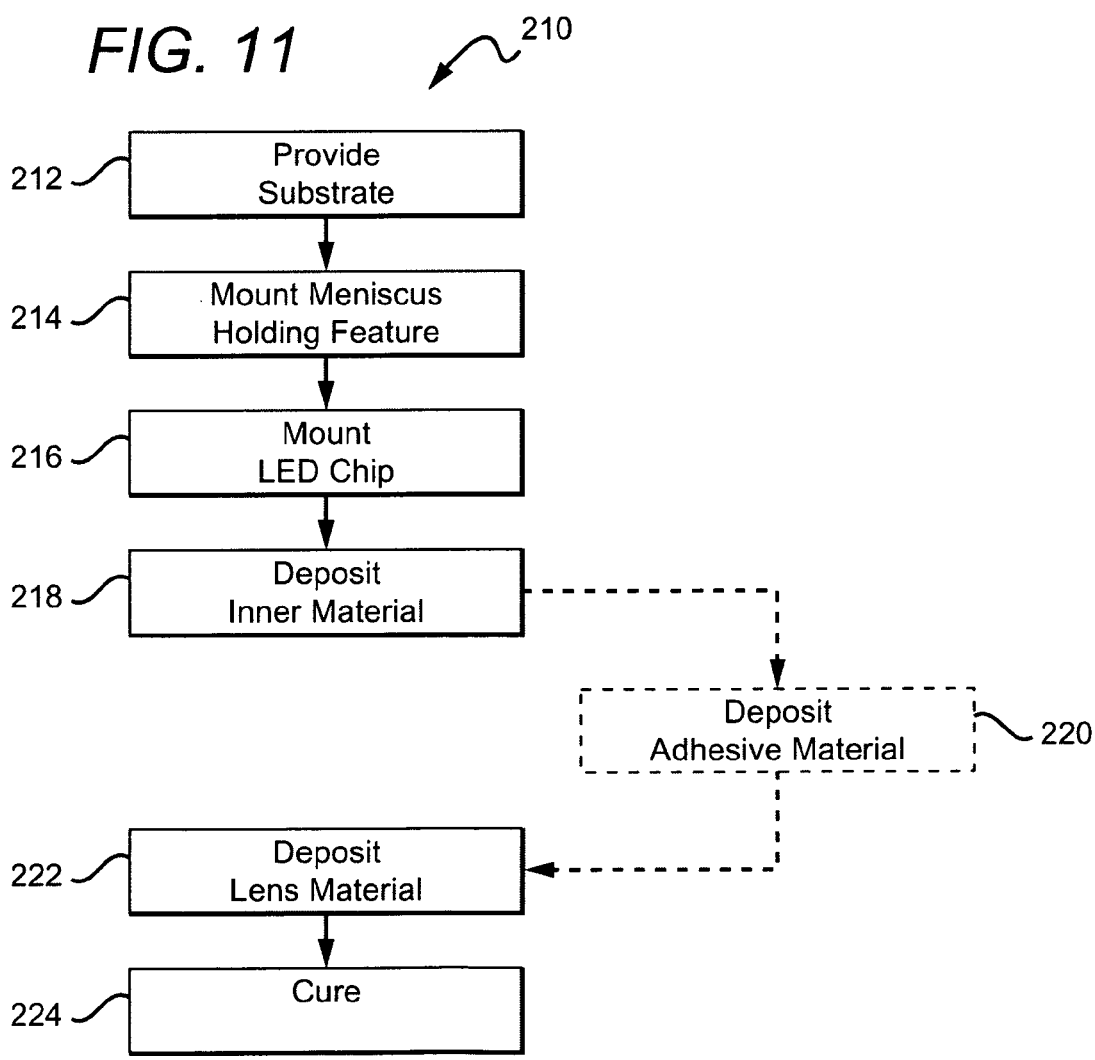
FIG. 11 is a flow diagram for one embodiment of a method according to the present invention.

FIG. 11 shows one embodiment of a method 210 according to the present invention. Although the method 210 is described with reference to an LED package, it is understood that the method can be used to fabricate other semiconductor device packages. It is further understood that although the method 210 is shown as a series of steps, the steps can occur in different order and different steps can be employed.

In 212, a substrate is provided that can be any number of different substrates, but is preferably similar to the substrate 42 described above and shown in FIGS. 2-6. In 214 a meniscus holding feature is mounted to the substrate using known mounting methods. Many different meniscus holding features can be used, including but not limited to the meniscus rings 24, 52, 72, 92, 108, 122, and 138 described above and shown in FIGS. 1-7. Alternatively, the meniscus ring can be formed as part of the substrate. It is also understood that more than one meniscus ring can be utilized in different embodiments including LED array embodiments. Further, the meniscus forming "feature" may comprise a chemical, rather than or in addition to, a geometrical barrier such that the lens material does not tend to "wet" regions outside of the feature, thereby forming the meniscus.

In 216 an LED chip is mounted to the substrate using known mounting methods such that an electric signal can be applied from the substrate to the LED chip. In one embodiment the electric signal is applied to the LED chip through at least one wire bond. The LED chip is preferably mounted inside the meniscus ring. In other embodiments multiple LED chips can be mounted to the substrate inside the meniscus ring, and for LED arrays, one or more LED chips can be mounted inside each of a plurality of meniscus rings.

In 218 a soft inner material is deposited in liquid form over and covering of the LED chip in a substantially hemispheric shape and is cured. For LED arrays, the soft material is included over each of the LED chips and cured, although in some embodiments less than all can be covered by the soft material. The wire bond is at least covered by said soft inner material. In some embodiments as mentioned above, an inner (second) meniscus ring or meniscus holding feature can be included around the LED chip to hold the soft inner material in its substantially hemispheric shape prior to curing.

In 220 an adhesive material can be included on the substrate to hold the lens and compensate for CTE mismatches. In 222 a lens material is included over the soft inner material in liquid form and then cured to state where it is harder than said inner material. The liquid lens material is preferably held in a substantially hemispheric shape by the meniscus formed between the liquid and meniscus holding feature. The liquid is preferably held and in 224 it is cured in its hemispheric shape.

Although the present invention has been described in detail with reference to certain preferred configurations thereof, other versions are possible. Therefore, the spirit and scope of the invention should not be limited to the versions described above.

We claim:

1. A light emitting diode (LED) package, comprising:
 a substrate;
 at least one LED chip on said substrate;
 an inner material covering said at least one LED chip;
 a lens covering said inner material, said lens being harder than said inner material;
 a first meniscus holding feature having a top surface and at least one outer side surface that faces away from said lens, said lens on said first meniscus holding feature and extending out to a falling edge defined by the intersection of said top surface and said at least one outer side surface of said meniscus holding feature, wherein a shape of said lens is at least partially defined by a meniscus formed by said first meniscus holding feature, wherein said meniscus holds the shape of said lens over said inner material; and
 an adhesive between said first meniscus holding feature and said lens, said adhesive holding said lens to said substrate, said adhesive disposed such that said lens and the remainder of said package can readily expand and contract even though said lens and said package may have different coefficients of thermal expansion.

2. The LED package of claim 1, wherein said at least one LED chip is in electrical contact with said substrate.

3. The LED package of claim 1, further comprising a second meniscus holding feature having a top surface and an outer side surface, said inner material extending out to a falling edge defined by the intersection of said top and side surfaces of said second meniscus holding feature.

4. The LED package of claim 1, wherein said inner material comprises a silicone.

5. The LED package of claim 1, wherein said inner material has a lower Shore durometer reading than said lens.

6. The LED package of claim 1, wherein said lens comprises silicone.

7. The LED package of claim 1, wherein said inner material further comprises light conversion materials.

8. The LED package of claim 1, further comprising at least one wire bond to apply an electrical signal to said at least one LED, at least part of said at least one wire bond covered by said inner material.

9. The LED package of claim 1, wherein said inner material and said lens are hemispheric shaped.

10. The LED package of claim 1, wherein said meniscus is formed at said first meniscus holding feature.

11. The LED package of claim 1, wherein said adhesive has a higher durometer reading than said inner material and has a lower durometer reading than said lens.

12. A light emitting diode (LED) package, comprising:
 a substrate;
 at least one LED chip mounted to said substrate;
 an inner material covering said at least one LED chip;
 a first meniscus holding feature on said substrate, said first meniscus holding feature having a top surface and at least one outer side surface that faces away from a lens;
 said lens made of a material that is harder than said inner material, said lens having a substrate contacting surface and mounted on said substrate and said first meniscus holding feature and over said inner material, said lens extending out to a falling edge defined by the intersection of said top surface and said at least one outer side surface of said first meniscus holding feature, said lens at least partially defined by a first meniscus, wherein said first meniscus holds a shape of said lens over said inner material;

an adhesive between said substrate and said lens, said adhesive holding said lens to said substrate, wherein said adhesive is between said first meniscus holding feature and said lens; and a second meniscus holding feature having a top surface and an outer side surface that faces away from said inner material, said inner material having a top surface defined by a second meniscus extending on said top surface out to a falling edge defined by the intersection of said top surface and outer side surface of said second meniscus holding feature;

wherein an inner surface of said lens is at least partially defined by said second meniscus.

13. The LED package of claim 12, wherein said adhesive further compensates for different coefficients of thermal expansion between said lens and the remainder of said package.

14. The LED package of claim 12, wherein said inner material further comprises light conversion materials.

15. The LED package of claim 12, further comprising at least one wire bond to apply an electrical signal to said at least one LED chip, at least part of said at least one wire bond covered by said inner material.

16. The LED package of claim 12, wherein said inner material has a hardness measuring less than 50 on Shore durometer 00 Scale.

17. The LED package of claim 12, wherein said lens has a hardness measuring greater than 30 on Shore durometer A Scale.

18. The LED package of claim 12, wherein said meniscus is formed at said first meniscus holding feature.

19. The LED package of claim 12, wherein said adhesive has a higher durometer reading than said inner material and has a lower durometer reading than said lens.

20. A light emitting diode (LED) package, comprising:
a substrate;
at least one LED chip on said substrate;
an inner material covering said at least one LED chip;
a lens covering said inner material, said lens being harder than said inner material;
a first meniscus holding feature having a top surface and at least one outer side surface that faces away from said lens, said lens on said first meniscus holding feature and extending out to a falling edge defined by the intersection of said top surface and said at least one outer side surface of said meniscus holding feature, wherein a shape of said lens is at least partially defined by a meniscus formed by said first meniscus holding feature, wherein said meniscus holds the shape of said lens over said inner material; and
an adhesive between said substrate and said lens, said adhesive holding said lens to said substrate, said adhesive directly contacting said lens, said adhesive disposed such that said lens and the remainder of said package can readily expand and contract even though said lens and said package may have different coefficients of thermal expansion.

21. The LED package of claim 20, wherein said at least one LED chip is in electrical contact with said substrate.

22. The LED package of claim 20, further comprising a second meniscus holding feature having a top surface and an outer side surface, said inner material extending out to a falling edge defined by the intersection of said top and side surfaces of said second meniscus holding feature.

23. The LED package of claim 20, wherein said inner material comprises a silicone.

24. The LED package of claim 20, wherein said inner material has a lower Shore durometer reading than said lens.

25. The LED package of claim 20, wherein said lens comprises silicone.

26. The LED package of claim 20, wherein said inner material further comprises light conversion materials.

27. The LED package of claim 20, further comprising at least one wire bond to apply an electrical signal to said at least one LED, at least part of said at least one wire bond covered by said inner material.

28. The LED package of claim 20, wherein said inner material and said lens are hemispheric shaped.

29. The LED package of claim 20, wherein said meniscus is formed at said first meniscus holding feature.

30. The LED package of claim 20, wherein said adhesive has a higher durometer reading than said inner material and has a lower durometer reading than said lens.

31. The LED package of claim 20, wherein said adhesive is between said first meniscus holding feature and said lens.

32. The LED package of claim 20, wherein said meniscus is formed at said first meniscus holding feature.

33. The LED package of claim 20, wherein said adhesive has a higher durometer reading than said inner material and has a lower durometer reading than said lens.

34. A light emitting diode (LED) package, comprising:
a substrate;
at least one LED chip mounted to said substrate;
a first meniscus holding feature on said substrate, said first meniscus holding feature having a top surface and at least one outer side surface that faces away from a lens;
an inner material covering said at least one LED chip;
said lens made of a material that is harder than said inner material, said lens having a substrate contacting surface and mounted on said substrate and said first meniscus holding feature and over said inner material, said lens extending out to a falling edge defined by the intersection of said top surface and said at least one outer side surface of said first meniscus holding feature, said lens at least partially defined by a meniscus, wherein said meniscus holds a shape of said lens over said inner material;
a second meniscus holding feature having a top surface and an outer side surface that faces away from said inner material, said inner material extending on said top surface out to a falling edge defined by the intersection of said top surface and outer side surface of said second meniscus holding feature; and
adhesive between said substrate and said lens, said adhesive holding said lens to said substrate, said adhesive directly contacting the lens.

35. The LED package of claim 34, wherein said adhesive is between said first meniscus holding feature and said lens.

36. The LED package of claim 34, wherein said adhesive further compensates for different coefficients of thermal expansion between said lens and the remainder of said package.

37. The LED package of claim 34, wherein said inner material further comprises light conversion materials.

38. The LED package of claim 34, further comprising at least one wire bond to apply an electrical signal to said at least one LED chip, at least part of said at least one wire bond covered by said inner material.

39. The LED package of claim 34, wherein said inner material has a hardness measuring less than 50 on Shore durometer 00 Scale.

40. The LED package of claim 34, wherein said lens has a hardness measuring greater than 30 on Shore durometer A Scale.

41. The LED package of claim 34, wherein said meniscus is formed at said first meniscus holding feature.

42. The LED package of claim 34, wherein said adhesive has a higher durometer reading than said inner material and has a lower durometer reading than said lens.

\* \* \* \* \*